(12) United States Patent
Wang et al.

(10) Patent No.: US 8,802,518 B2
(45) Date of Patent: Aug. 12, 2014

(54) SEMICONDUCOR DEVICE AND METHOD FOR MANUFACTURING THE SAME

(75) Inventors: Wenwu Wang, Beijing (CN); Chao Zhao, Kessel-Lo (BE); Kai Han, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 130 days.

(21) Appl. No.: 13/395,608

(22) PCT Filed: Oct. 17, 2011

(86) PCT No.: PCT/CN2011/001726
§ 371 (c)(1),
(2), (4) Date: Mar. 12, 2012

(87) PCT Pub. No.: WO2012/075670
PCT Pub. Date: Jun. 14, 2012

(65) Prior Publication Data
US 2013/0092986 A1    Apr. 18, 2013

(51) Int. Cl.
*H01L 29/66* (2006.01)
*H01L 21/8238* (2006.01)
*H01L 21/28* (2006.01)
*H01L 29/49* (2006.01)
*H01L 21/8234* (2006.01)
H01L 29/51 (2006.01)
H01L 29/423 (2006.01)

(52) U.S. Cl.
CPC .. *H01L 21/82345* (2013.01); *H01L 21/823842* (2013.01); *H01L 21/28114* (2013.01); *H01L 29/4966* (2013.01); H01L 29/517 (2013.01); *H01L 29/66545* (2013.01); H01L 29/6656 (2013.01); *H01L 21/823468* (2013.01); *H01L 21/823828* (2013.01); H01L 29/513 (2013.01); *H01L 29/6653* (2013.01); *H01L 21/823864* (2013.01); H01L 29/42376 (2013.01)
USPC ................... 438/183; 257/E21.444

(58) Field of Classification Search
USPC .................................. 438/183; 257/E21.444
IPC ..................................................... H01L 29/66545
See application file for complete search history.

(56) References Cited

U.S. PATENT DOCUMENTS 6,495,437 B1 * 12/2002 Yu ................................. 438/591
2009/0087974 A1 * 4/2009 Waite et al. ................... 438/592

* cited by examiner

*Primary Examiner* — Amar Movva
(74) *Attorney, Agent, or Firm* — Troutman Sanders LLP

(57) ABSTRACT

A semiconductor device and a method for manufacturing the same, the method comprising: providing a semiconductor substrate; forming a dummy gate area on the substrate, forming spacers on sidewalls of the gate area, and forming source and drain areas in the semiconductor substrate on both sides of the dummy gate area, the dummy gate area comprising an interface layer and a dummy gate electrode; forming a dielectric cap layer on the dummy gate area and source and drain areas; planarizing the device with the dielectric cap layer on the source and drain areas as a stop layer; further removing the dummy gate electrode to expose the interface layer; and forming replacement gate area on the interface layer. The thickness of the gate groove may be controlled by the thickness of the dielectric cap layer, and the replacement gates of desired thickness and width may be further formed upon requirements. Thus, the aspect ratio of the gate groove is reduced and a sufficient low gate resistance is ensured.

9 Claims, 7 Drawing Sheets

SEMICONDUCOR DEVICE AND METHOD FOR MANUFACTURING THE SAME

CROSS REFERENCE

This application is a National Phase application of, and claims priority to, PCT Application No. PCT/CN2011/001726, filed on Oct. 17, 2011, entitled 'SEMICONDUCTOR DEVICE AND METHOD FOR MANUFACTURING THE SAME', which claimed priority to Chinese Application No. CN201010589244.X, filed on Dec. 8, 2010. Both the PCT Application and Chinese Application are incorporated herein by reference in their entireties.

FIELD OF THE INVENTION

The present invention relates to a semiconductor device and a method for manufacturing the same, and particularly to a semiconductor device based on gate replacement technology and a method for manufacturing the same.

BACKGROUND OF THE INVENTION

The research of CMOS device gate engineering with the "high-K gate dielectric/metal gate" as the core technique is a most typical key process in the techniques of 22 nm node and below, and researches on materials, processes, and structures associated therewith are widely carried out. Currently, researches on the high-K gate dielectric/metal gate technique may be generally divided into the gate-first process where a gate is formed before formation of the source and drain and the gate replacement process where a gate is formed after formation of the source and drain, in which process the gate need not to experience high annealing temperature.

For the gate-last process, a very important process is filling of high-K gate dielectrics and metal gate materials in the gate groove. With continuous reduction in the feature size of a MOS device, particularly when it enters into 22 nm and below technical nodes, the physical gate length of a MOS device has been reduced to 30 nm below, and meanwhile the height of the gate shall also be kept at a certain level (e.g., about 30 nm) so as to reduce the gate resistance. However, great difficulty exists when filling various materials in such a nano-scale gate groove with an aspect ratio larger than 1. Typical difficulties lie in the uniformity of the metal gate layer and high-K gate dielectric layer in the gate groove as well as the holes in the filled metal. The holes in the filled metal appear mainly due to an intrinsic phenomenon of Step Coverage during thin film deposition. Although we could overcome the Step Coverage by optimizing deposition methods and improving deposition conditions, optimizing the gate structure and reducing the aspect ratio of the gate groove shall be a more efficient solution in terms of the filling capability for a narrow trench.

So, there exists a need for a semiconductor device based on gate replacement technology and a method for manufacturing the same, which can both reduce the aspect ratio of a gate groove and ensure a sufficiently low gate resistance.

SUMMARY OF THE INVENTION

In view of the above problems, the present invention provides a method for manufacturing a semiconductor device, comprising: A. providing a semiconductor substrate; B. forming a dummy gate area on the substrate, forming spacers on sidewalls of the gate area, and forming source and drain areas in the semiconductor substrate on both sides of the dummy gate area, the dummy gate area comprising an interface layer and a dummy gate electrode; C. planarizing the device with a dielectric cap layer on the source and drain areas as a stop layer; D. planarizing the device to expose the dielectric cap layer; E. further removing the dummy gate electrode to expose the interface layer; F. forming a replacement gate area on the interface layer; and G performing subsequent processing to the device.

The present invention also provides a device manufactured by the above method, the device comprising: a semiconductor substrate; an interface layer formed on the semiconductor substrate and first spacers formed on sidewalls of the interface layer; source and drain areas formed in the semiconductor substrate on both sides of the interface layer; a dielectric cap layer formed on the source and drain areas, the dielectric cap layer having the same height as the first spacer; and a gate area formed on the interface layer, the gate area comprising a gate dielectric layer and a gate electrode thereon.

By using the method of the present invention, the thickness of the gate groove may be controlled by the thickness of the dielectric cap layer, and replacement gates of desired thickness and width may be further formed upon requirements. Since the thickness of the dielectric cap layer is much smaller than the thickness of the replacement gate, the aspect ratio of the gate groove is reduced, and a sufficient low gate resistance is ensured, while maintaining the original advantages of the gate-last process.

DETAILED DESCRIPTION OF THE EMBODIMENTS

The present invention generally relates to a semiconductor device and a method for manufacturing the same. Many different embodiments or examples are disclosed herein to implement different structures of the present invention. To simplify the disclosure of the present invention, the components and settings of specific examples are described below. Of course, they are only examples and are not intended to limit the present invention. Furthermore, reference numbers and/or letters may be repeated in different examples of the present invention. Such repetitions are for simplification and clearness, which per se do not indicate the relations of the discussed embodiments and/or settings. Moreover, the present invention provides examples of various specific processes and materials, but the applicability of other processes and/or application of other materials may be appreciated by those having ordinary skill in the art. Besides, the following described structure where a first feature is "above" a second feature may either comprise the embodiment where the first feature and the second feature are directly contacted, or may comprise the embodiment where additional features are formed between the first feature and the second feature, and thus the first feature and the second feature may not be directly contacted.

Figure 1:
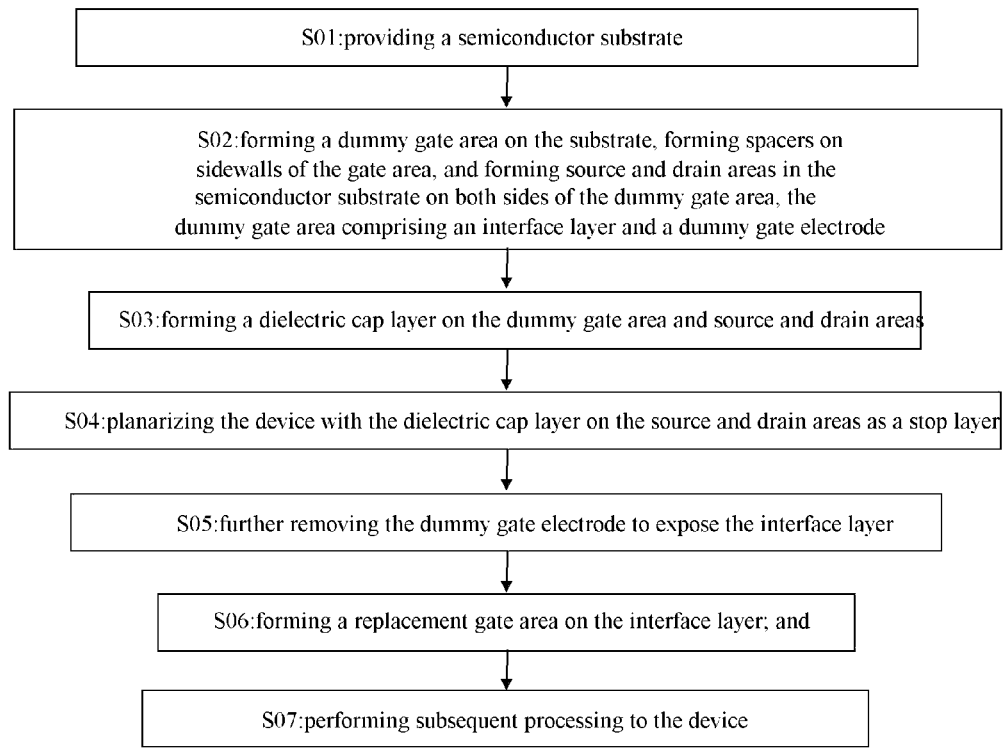
FIG. 1 illustrates a flow chart of a method for manufacturing the semiconductor device according to an embodiment of the present invention.
Figure 2:
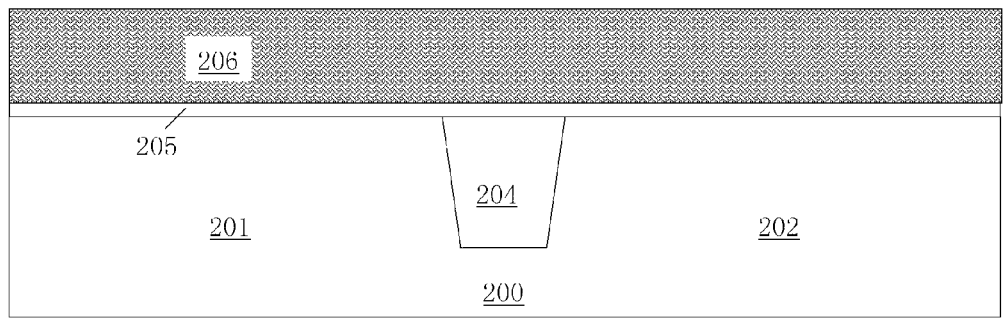
FIGS. 2-17 illustrate schematic diagrams showing the stages of manufacturing the semiconductor device according to the embodiment of the present invention.

Referring to FIG. 1, it illustrates a flow chart of a method for manufacturing a semiconductor device according to an embodiment of the present invention. At step S01, a semiconductor substrate is provided. Referring to FIG. 2, in this embodiment, a semiconductor substrate 200 has a first area 201 and a second area 202, the first area 201 and the second area 202 are separated from each other by an isolation area 204. The substrate 200 may comprise a silicon substrate (e.g., a wafer) in a crystal structure, and may also comprise other basic semiconductors or compound semiconductors, such as Ge, GeSi, GaAs, InP, SiC or diamond. In accordance with the common design requirements in the prior art (e.g., a p-type substrate or an n-type substrate), the substrate 200 may comprise various doping configurations. Furthermore, the substrate 200 may optionally comprise an epitaxial layer, may be manipulated by stress to enhance performance, and may comprise a Silicon-On-Insulator (SOI) structure. The isolation area 204 may comprise silicon oxide or other materials that can separate active areas of the device.

At step S02, a dummy gate area comprising an interface layer and a dummy gate electrode is formed on the substrate, spacers are formed on the sidewalls of the gate area, and source and drain areas are formed in the semiconductor substrate on both sides of the dummy gate area. The structure in the step may be formed by using conventional process steps, materials and devices.

In one embodiment, referring to FIGS. 2-5, specifically, interface layer 205 and dummy gate electrode 206 are formed sequentially in the substrate 200, referring to FIG. 2, the interface layer 205 may comprise $SiO_2$, $SiON_X$, $HfSO_X$, etc. and may have a thickness of about 0.3-1 nm, and the dummy gate 206 may comprise amorphous silicon or polysilicon and may have a thickness of about 10-60 nm.

Figure 3:
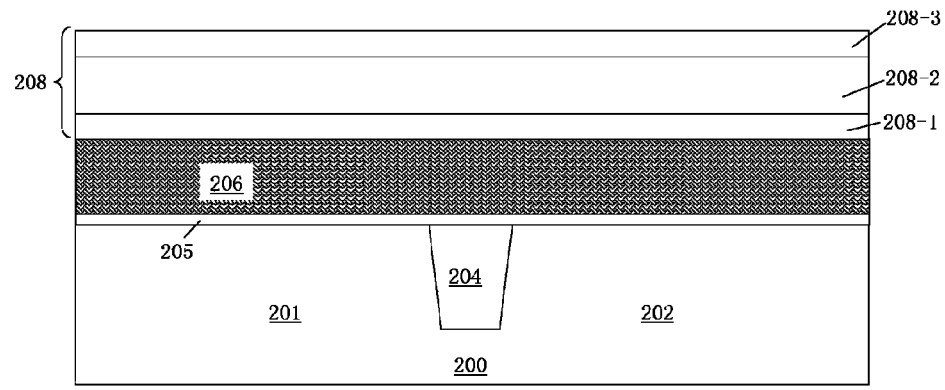

Second, a hard mask 208 is formed on the dummy gate electrode 206. In this embodiment, a hard mask 208 is formed by sequentially depositing a first hard mask 208-1 of $SiO_2$, a second hard mark 208-2 of $Si_3N_4$ and a third hard mask 208-3 of $SiO_2$. Referring to FIG. 3, the hard masks 208-1, 208-3 of $SiO_2$ may have a thickness of about 5-30 nm successively, and the second hard mark 208-2 of $Si_3N_4$ may have a thickness of about 10-70 nm. However, the hard mask may also be other structures formed by other materials. Here it is only an example, and is not limited thereto.

Figure 4:
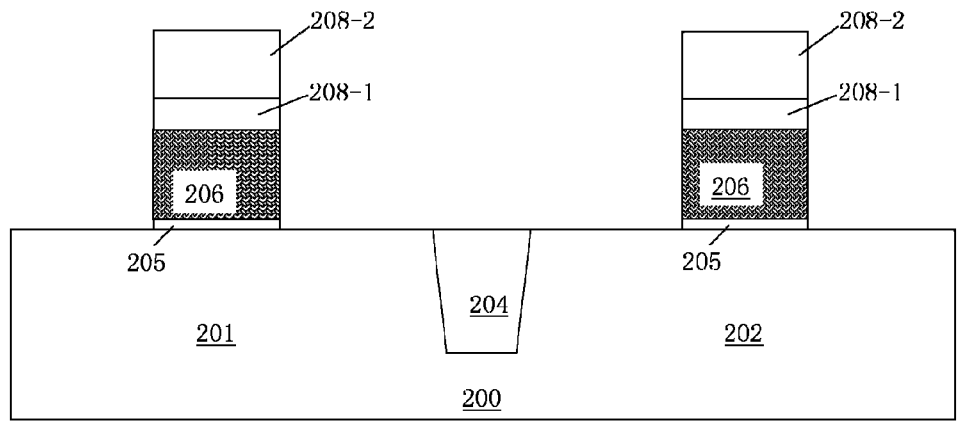

Next, patterning is performed. Referring to FIG. 4, the stack of the interface layer 205, a dummy gate electrode 206, and a hard mask 208 may be etched by using dry or wet etching technology, and may be washed to form a structure as shown in FIG. 4 on the first area 201 and the second area 202, wherein the third hard mask 208-3 is removed during etching and subsequent washing.

Figure 5:
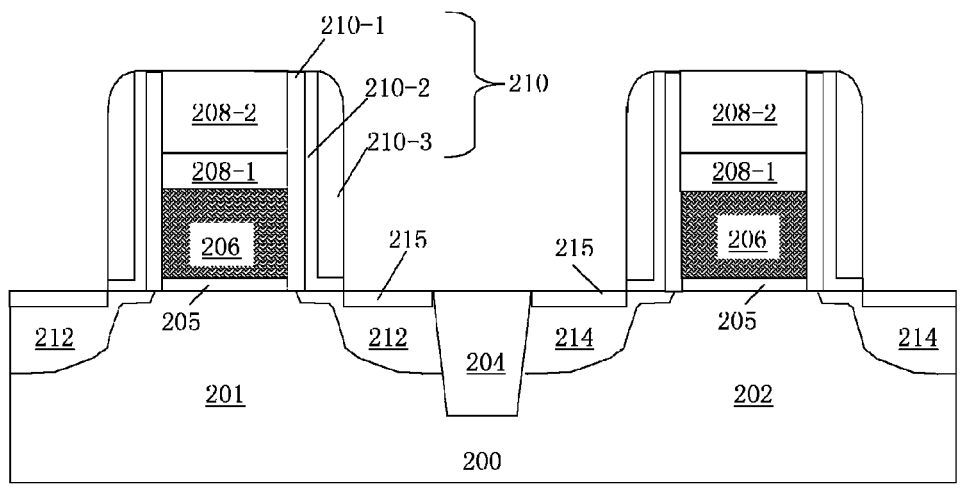

Then, the spacer 210 is formed on sidewalls of the interface layer 205, the dummy gate electrode 206 and the stack of the hard masks 208-1, 208-2. Referring to FIG. 5, in one embodiment, the spacer 210 is a three-layer structure, i.e., a first spacer 210-1 of $Si_3N_4$ with a thickness of about 5-15 nm, a second spacer 210-2 of $SiO_2$ with a thickness of about 2-10 nm, and a third spacer 210-3 of $Si_3N_4$ with a thickness of about 10-40 nm are sequentially formed by deposition and etching. However, the spacer may also be other structures comprising other materials. Here it is only an example, and is not limited thereto.

Thereafter, source and drain areas 212 and 214 may be formed by doping p-type or n-type dopants or impurities into the substrate 200 of the first area 201 and second area 202 according to a desired transistor structure. Referring to FIG. 5, source and drain areas 212 and 214 may be formed by processes of photolithography, ion implantation, diffusion and/or other appropriate processes. Furthermore, optionally, source and drain extension areas may be formed after the first spacer 210-1 is formed. Preferably, metal silicide 215 may also be formed on the source and drain areas by a process of self-alignment metal siliconization after source and drain areas 212 and 214 are formed, so as to reduce contact resistance.

Figure 6:
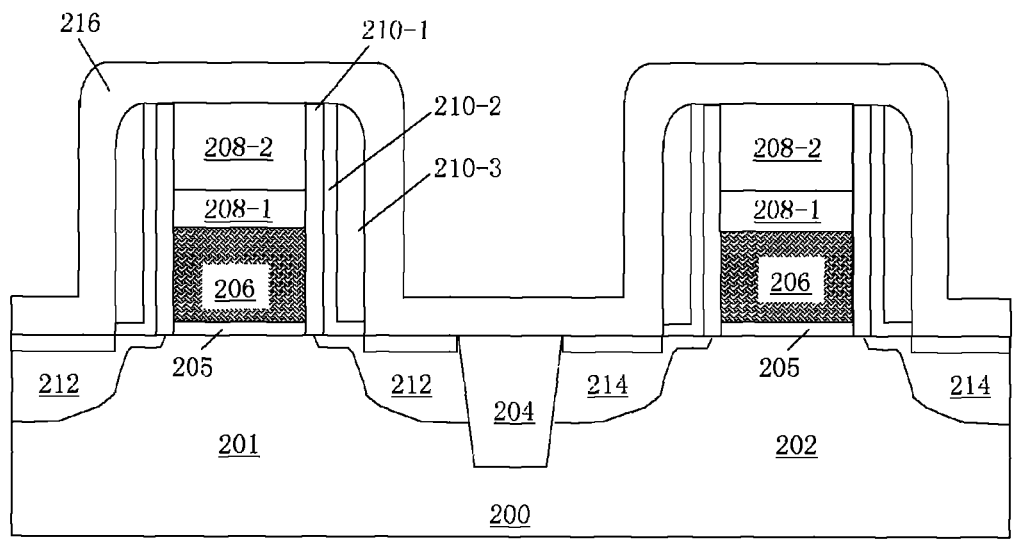

At step S03, a dielectric cap layer is formed on the dummy gate area and the source and drain areas. Referring to FIG. 6, a dielectric cap layer 216 is deposited on the device structure. The dielectric cap layer 216 may comprise $Si_3N_4$, $SiO_2$ or low-k materials, and may be formed by Atomic Layer Deposition (ALD), Plasma Enhanced Chemical Vapor Deposition (PECVD) or other methods. The dielectric cap layer 216 may have a thickness of about 5-60 nm, and has a height higher than the interface layer. In the present invention, the height of the gate groove in subsequent processes is controlled by the thickness of the dielectric cap layer (in the gate-last process, the trench formed by the dummy gate is removed).

Figure 7:
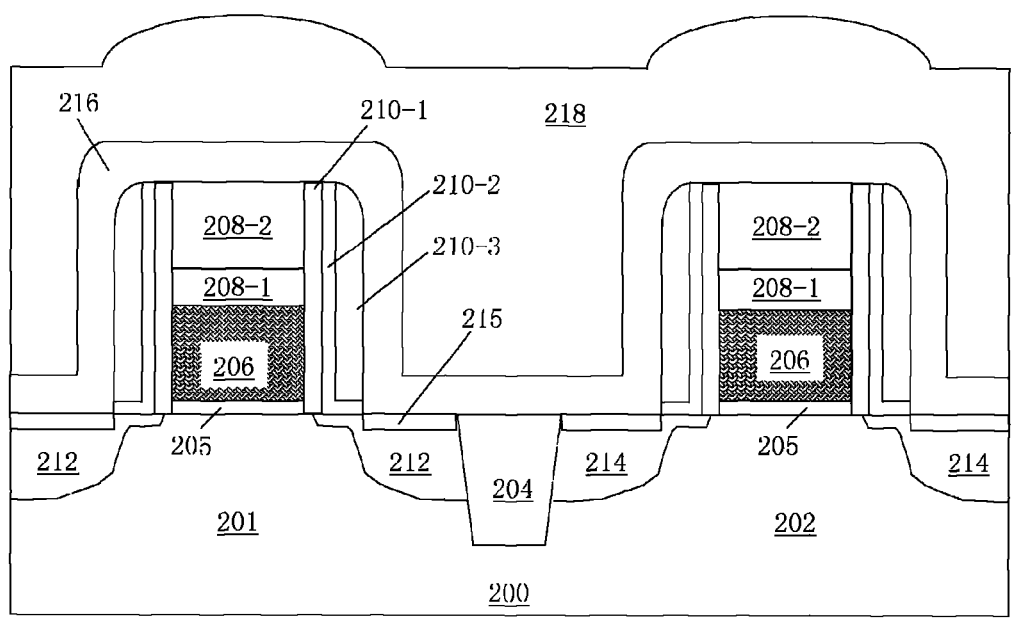

Preferably, in order to prevent the negative effect on the gate structure of a small size by planarization in subsequent processes, referring to FIG. 7, a dielectric layer 218 may be further deposited on the above device. The dielectric layer 218 consists of a material different from that of the dielectric cap layer 216, so that the subsequent planarization process may stop on the dielectric cap layer 216.

Figure 8:
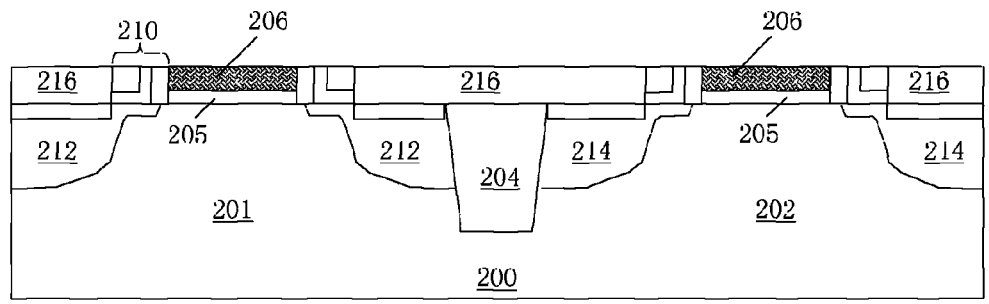

At step S04, the device is planarized with the dielectric cap layer on the source and drain areas as a stop layer. The device as shown in FIG. 6 or FIG. 7 may be planarized by a Chemical-Mechanical Polishing (CMP) process, and the dielectric cap layer 216 on the source and drain areas 214 and 216 serves as a stop layer, referring to FIG. 8.

Figure 9:
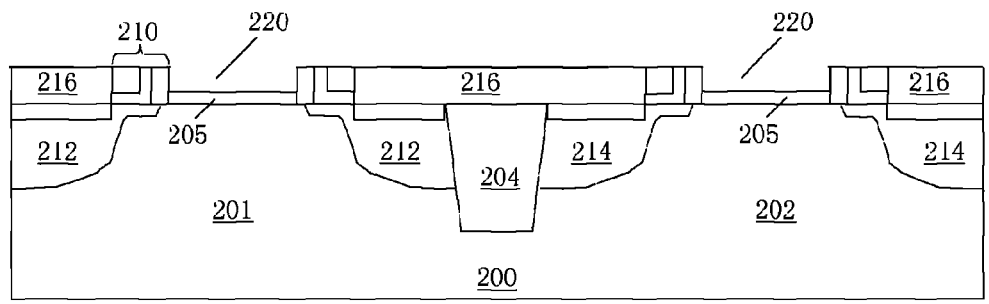

At step S05, the dummy gate electrode is further removed to expose the interface layer. Referring to FIG. 9, the residual dummy gate electrode 206 may be removed to expose the interface layer 205 by an RIE process, so as to form gate groove 220. Therefore, the height of the gate groove 220 is determined by the thickness of the dielectric cap layer 216. Since the thickness of the dielectric cap layer is much smaller than the thickness of the replacement gate, the aspect ratio of the gate groove is reduced, and thus the filling capability for a narrow trench is enhanced when a replacement gate is further formed. In addition, preferably, the interface layer 205 may be further removed by using wet etching, and a new interface layer 205 may be re-formed, so as to improve the quality of the interface layer.

At step S06, a replacement gate area comprising a gate dielectric layer and a gate electrode is formed. The gate electrode may either be formed within the range of the width of the gate groove, or be formed inside and outside the gate groove to reduce the gate resistance. The processes may include the following steps.

Figure 10:
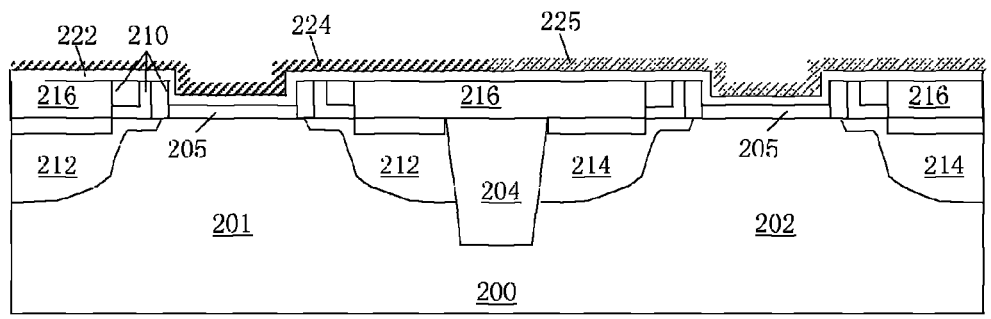
Figure 11:
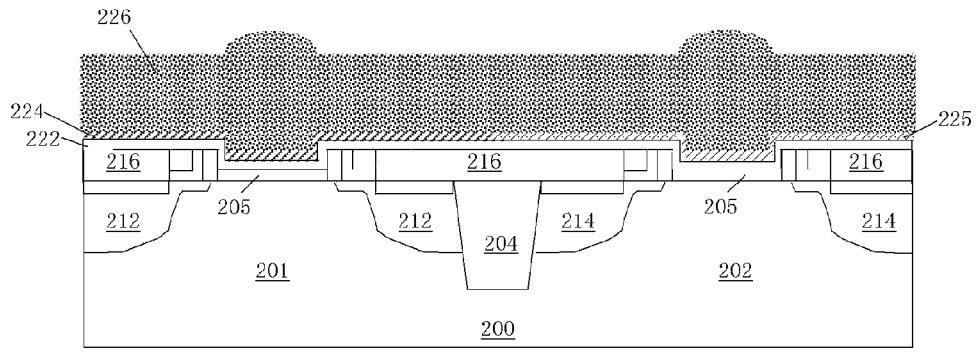
Figure 12:
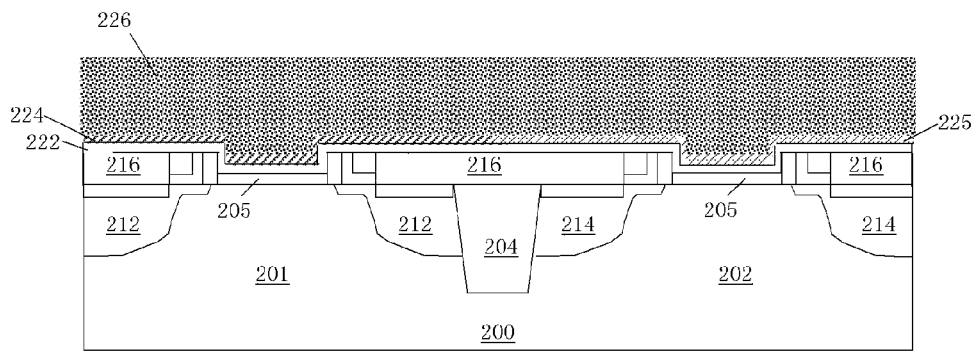
Figure 13:
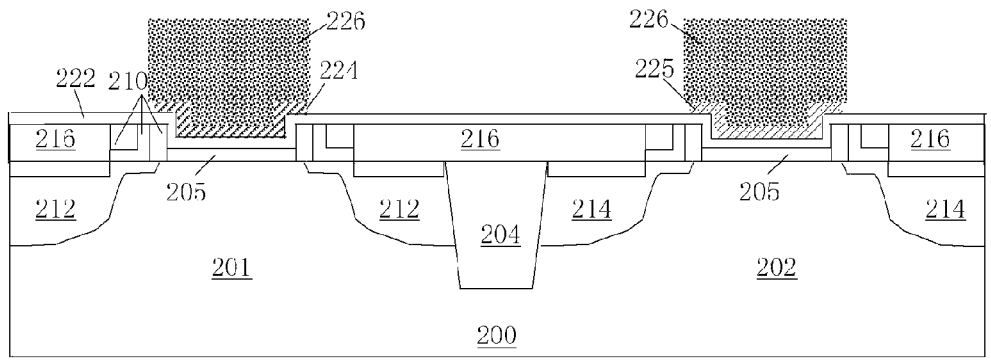
Figure 16:
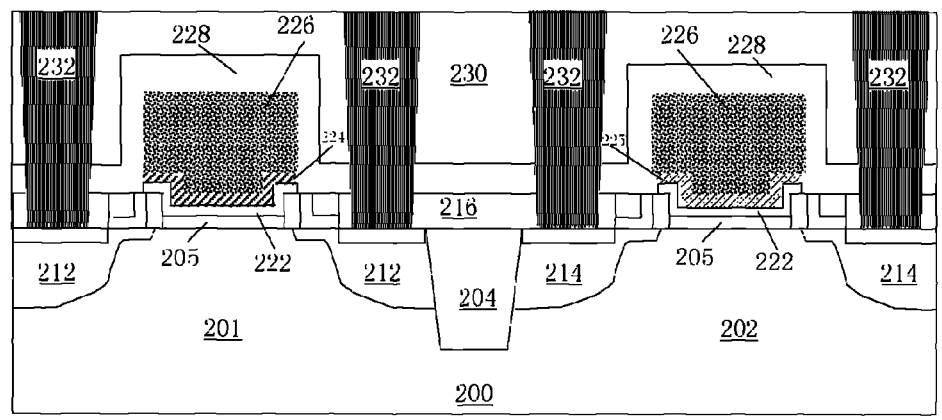
Figure 17:
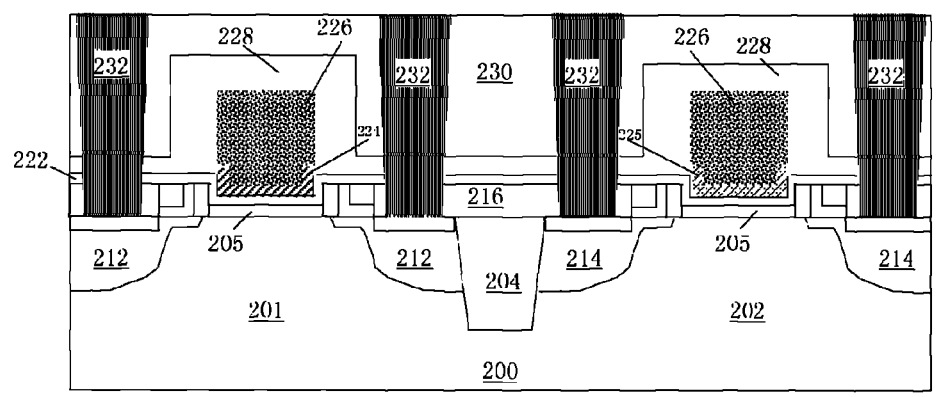

First, as shown in FIGS. 10 and 11, a gate dielectric layer 222 and a gate electrode are sequentially deposited on the device. The gate dielectric layer 222 may include, but not limit to, high-K dielectric materials (such as materials having high-K dielectrics as compared with silicon oxide) and may have a thickness of about 0.8-4 nm. The high-K dielectric materials, for example, may include hafnium-based materials such as $HfO_2$, HfSiO, HfSiON, HfTaO, HfSiO, HfZrO, their combinations and/or other appropriate materials. The gate electrode may be of a one-layer or multi-layer structure, and the gate electrode in the first area and the second area may consist of the same or different materials. In the illustrated embodiment, the gate electrode is a two-layer structure, and the gate electrodes on the first area and the second area are made of different materials (n-type and p-type metal materials). First metal gates 224, 225 of different materials may be respectively formed by depositing a first metal gate 224, e.g., made of TiAlN, with a thickness of about 1-10 nm, on the device and removing the first metal gate 224 on the second area 202, then depositing another metal gate 225, e.g., made of TiN, with a thickness of about 1-10 nm, then removing the metal gate 225 on the first area 201. Then, a second metal gate 226 is further deposited on the device, referring to FIG. 11. The second metal gate 226 may comprise low resistance metal materials such as Al, Ti, TiAl$_X$ and W, etc. Next, the second metal gate 226 is planarized by CMP, as shown in FIG. 12. Thereafter, patterning is performed. In an embodiment, only the gate electrode is patterned. The gate electrode may be removed according to requirements while performing patterning, to thereby form a replacement gate of a gate electrode having different widths, referring to FIG. 13. The gate electrodes 224 and 226 have a width larger than the width of the gate groove (i.e., the width of the interface layer 205), and thus the replacement gates have smaller gate resistance, referring to FIG. 17. the replacement gates where the gate electrodes 224 and 226 have the same width as the gate groove may also be formed. In other embodiments, patterning may be further performed to the gate dielectric layer 222, referring to FIG. 16.

Figure 14:
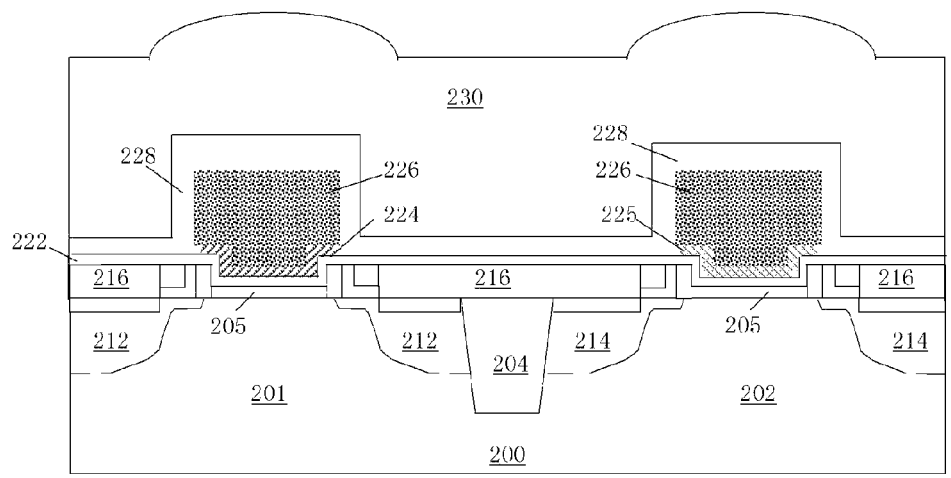
Figure 15:
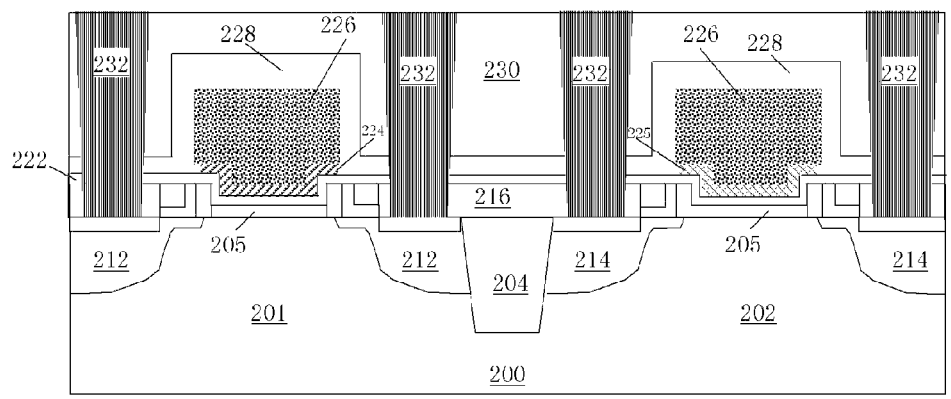

After that, the device is subsequently processed according to requirements. For example, replacement spacers 228 may be formed on sidewalls of the replacement gate area, and an interlayer dielectric layer 230 may be formed to cover the device, referring to FIG. 14. Subsequently, contact plugs 232 may be formed on the source and drain areas, referring to FIGS. 15-17.

Detailed descriptions of the method for manufacturing the semiconductor device in the embodiment of the present invention are provided in the foregoing paragraphs. Besides, the present invention also provides a semiconductor device formed according to the above method, referring to FIGS. 15-17, the device comprising: the semiconductor substrate 200; the interface layer 202 formed on the semiconductor substrate 200, and the first spacer 210 formed on sidewalls of the interface layer 205; source and drain areas 212, 214 in the semiconductor substrate on both sides of the interface layer 205; the dielectric cap layer 216 formed on the source and drain areas, the dielectric cap layer 216 having the same height as the first spacer 210; a gate area formed on the interface layer 205, the gate area comprising the gate dielectric layer 222 and a gate electrode thereon. The first spacer may have a thickness larger than the thickness of the interface layer. The dielectric cap layer may have a thickness of about 5-60 nm. Upon requirements, the gate area may have a width larger than or equal to the width of the interface layer. When the width of the gate area is larger than the width of the interface layer, the device may further comprise a gate dielectric layer formed on the inner wall of the first spacer and on a part of the first spacer, and a gate area on the gate dielectric layer, or the device may further comprise a gate dielectric layer formed on the inner wall of the first spacer, on the first spacer and on the dielectric cap layer, and a gate area above the gate dielectric layer formed on the inner wall of the first spacer and on a part of the first spacer. The gate dielectric layer comprises high-K dielectric materials, and the gate electrode comprises an n-type or p-type metal gate.

Detailed descriptions of the semiconductor device formed by the gate-last process where the height of the gate groove is controlled by using a dielectric cap layer and manufacturing thereof are provided in the foregoing paragraphs. In the present invention, the thickness of the gate groove may be controlled by the thickness of the dielectric cap layer, and replacement gates of desired thickness and width may be further formed according to requirements. Since the thickness of the dielectric cap layer is much smaller than the thickness of the replacement gate, the aspect ratio of the gate groove is reduced, such that the filling capability for a narrow trench is enhanced and a sufficient low gate resistance is ensured while maintaining the original advantages of the gate-last process.

Although the illustrative embodiments and their advantages have been described in detail, it shall be appreciated that various changes, substitutions and modifications can be made to these embodiments without departing from the spirit of the invention and the scope defined by the attached claims. As for other examples, it may be appreciated by those having ordinary skill in the art that the sequence of the process steps may be changed while keeping the protection scope of the present invention.

In addition, the present invention is applied to a scope that shall not limited by the processes, mechanisms, manufacture, material constitutions, measures, methods and steps described in the specific embodiments of the Specification. From the disclosure of the present invention, it may be appreciated by those having ordinary skill in the art that for the processes, mechanisms, manufacture, material constitutions, measures, methods or steps which currently exist or will be developed where they perform substantially the same functions or achieve substantially the same effects as the corresponding embodiments of the present invention, they can be applied in accordance with the present invention. Therefore, the appended claims of the present invention aim to comprise these processes, mechanisms, manufacture, material constitutions, measures, methods or steps within their protection scopes.

What is claimed is:

1. A method for manufacturing a semiconductor device, comprising:
    A. providing a semiconductor substrate;
    B. forming a dummy gate area on the substrate, forming spacers on sidewalls of the gate area, and forming source and drain areas in the semiconductor substrate on both sides of the dummy gate area, the dummy gate area comprising an interface layer and a dummy gate electrode;
    C. forming a dielectric cap layer on the dummy gate area and source and drain areas;
    C1. forming another dielectric layer on the dielectric cap layer which is different from the dielectric cap layer;
    D. planarizing the device with the dielectric cap layer on the source and drain areas as a stop layer so as to remove all of the another dielectric layer;
    E. further removing the dummy gate electrode to expose the interface layer;
    F. forming a replacement gate area on the interface layer; and
    G. performing subsequent processing to the device.

2. The method according to claim 1, wherein the step F comprises: sequentially depositing a gate dielectric layer and a gate electrode on the device; patterning the gate electrode to form the replacement gate area, wherein the gate electrode has a width larger than or equal to the width of the interface layer.

3. The method according to claim 1, wherein the step F comprises: sequentially depositing a gate dielectric layer and a gate electrode on the device; patterning the gate electrode and the gate dielectric layer to form the replacement gate area, wherein the gate electrode has a width larger than or equal to the width of the interface layer.

4. The method according to claim 1, wherein between the step C and step D, the method further comprises: forming a dielectric layer to cover the device, the dielectric layer consisting of a material different from the dielectric cap layer.

5. The method according to claim 1, wherein between the step E and step F, the method further comprises: removing the interface layer, and re-forming the interface layer.

6. The method according to claim 1, wherein the dielectric cap layer has a thickness larger than the thickness of the interface layer.

7. The method according to claim 1, wherein the dielectric cap layer has a thickness of about 5-60 nm.

8. The method according to claim 2, wherein the gate dielectric layer comprises high-K dielectric materials, and the gate electrode comprises an n-type or p-type metal gate.

9. The method according to claim 1, wherein the step G comprises: forming replacement spacers on sidewalls of the replacement gate area, forming an interlayer dielectric layer covering the device, and forming contact plugs on the source and drain areas.

* * * * *

UNITED STATES PATENT AND TRADEMARK OFFICE
CERTIFICATE OF CORRECTION

PATENT NO. : 8,802,518 B2
APPLICATION NO. : 13/395608
DATED : August 12, 2014
INVENTOR(S) : Wenwu Wang et al.

It is certified that error appears in the above-identified patent and that said Letters Patent is hereby corrected as shown below:

Title Page, item (54) and in the Specification, Col. 1, lines 1-2,

Please correct the title from: "SEMICONDUCOR DEVICE AND METHOD FOR MANUFACTURING THE SAME"

to read as:

--SEMICONDUCTOR DEVICE AND METHOD FOR MANUFACTURING THE SAME--

Signed and Sealed this
Sixteenth Day of December, 2014

Michelle K. Lee
*Deputy Director of the United States Patent and Trademark Office*